May 5, 1970 H. SCHWAB ET AL 3,510,828

MICROCIRCUIT HARDWARE

Filed May 23, 1966 3 Sheets-Sheet 1

INVENTORS.
HELMUT SCHWAB
STANLEY E. BEALE
BY
Christie, Parker & Hale
ATTORNEYS

May 5, 1970 H. SCHWAB ET AL 3,510,828

MICROCIRCUIT HARDWARE

Filed May 23, 1966 3 Sheets-Sheet 3

INVENTORS.
HELMUT SCHWAB
STANLEY E. BEALE

BY Christie, Parker & Hale

ATTORNEYS

United States Patent Office 3,510,828
Patented May 5, 1970

3,510,828

MICROCIRCUIT HARDWARE

Helmut Schwab, Altadena, and Stanley E. Beale, Duarte, Calif., assignors to Scanbe Manufacturing Corporation, Monterey Park, Calif., a corporation of California Filed May 23, 1966, Ser. No. 552,136
Int. Cl. H01r 13/46
U.S. Cl. 339—174 2 Claims

ABSTRACT OF THE DISCLOSURE

A microcircuit assembly system for direct wiring of microcircuit packages having a pair of electrically conductive mounting elements arranged for slidably receiving and holding a microcircuit package assembly therebetween and functioning as electrical conduits for powering the microcircuit packages held therebetween.

This invention relates to hardware for the handling, packaging and interconnecting a microcircuit package.

The disclosed invention is related to the invention described and claimed in our copending patent application bearing Ser. No. 476,619 entitled Integrated Circuit Hardware and assigned to the same assignee as the present application.

The handling and interconnecting of a microcircuit or integrated circuit package is a difficult problem due to its small size and which small size causes all manner of inconveniences and problems. At present, the handling and packaging of these integrated circuits has been developed primarily for use with printed circuit boards rather than employed in a complete integrated circuit system. Since many of the techniques and hardware for handling and interconnecting integrated circuit packages have been developed with this end use in mind, they may not be readily adapted for use without a printed circuit board. Accordingly, there is a need in the art for improved hardware for handling and packaging and interconnecting integrated or microcircuit packages and integrating them into a microcircuit system that may be employed with or without printed circuit boards.

The present invention provides improved and relatively inexpensive hardware for packaging and interconnecting a single integrated or microcircuit package or a plurality of microcircuit packages in a single piece of hardware. Both the multi-circuit and single-circuit hardware is advantageously constructed and defined so that it may be incorporated and interconnected into a conventional equipment drawer for storing a large number of such microcircuit packages in the same general fashion in which printed circuit cards are mounted and stored in such equipment drawers at the present time. The packaging of the hardware of the invention in an equipment drawer may be in terms of a bus bar system adapted to receive the hardware. Both the multi-circuit package hardware and the single circuit package hardware are provided with means for rendering access to the individual microcircuit package per se as well as identifying the individual circuits.

Structurally, the present invention comprises a base member adapted to receive and mount a packaged microcircuit and constructed and defined to include a plurality of individual electrical contacts for providing electrical engagement with the electrical conductors or ribbons of the integrated circuit package. Each of the electrical conductors of the packaged microcircuit are maintained in a spaced, insulative relationship and by means of the electrical contacts of the base member provide electrical contact for all of the conductors or ribbons at a single side of the base member. A cover member is provided for securing a microcircuit package to the base member and clamping the electrical contacts and electrical conductors in electrical engagement. The cover member may be removable and may include means for visably identifying the microcircuit package.

The aforementioned hardware may be defined as a microcircuit "stick" for holding a plurality of microcircuit packages. For this purpose, the base member may be adapted to receive and mount a plurality of packaged microcircuits with all of the electrical contacts of the plurality of microcircuit packages extending from a single side of the base member. Such a "stick" is constructed and defined to be slidably received by a bus bar system in accordance with the present invention. The bus bar system may comprise a pair of electrical conductors spaced apart in accordance with a preselected dimension of the microcircuit "stick" or single circuit hardware for slidably receiving same therebetween with the electrical contacts being connected to the bus bar system for powering the microcircuits per se. The bus bar may be further defined as double-faced electrical conductors insulated from one another to allow the bus bar to power microcircuits arranged side by side in an equipment drawer for storage purposes.

These and other features of the present invention may be more fully appreciated when considered in the light of the following specifications and drawings in which.

Figure 2A:
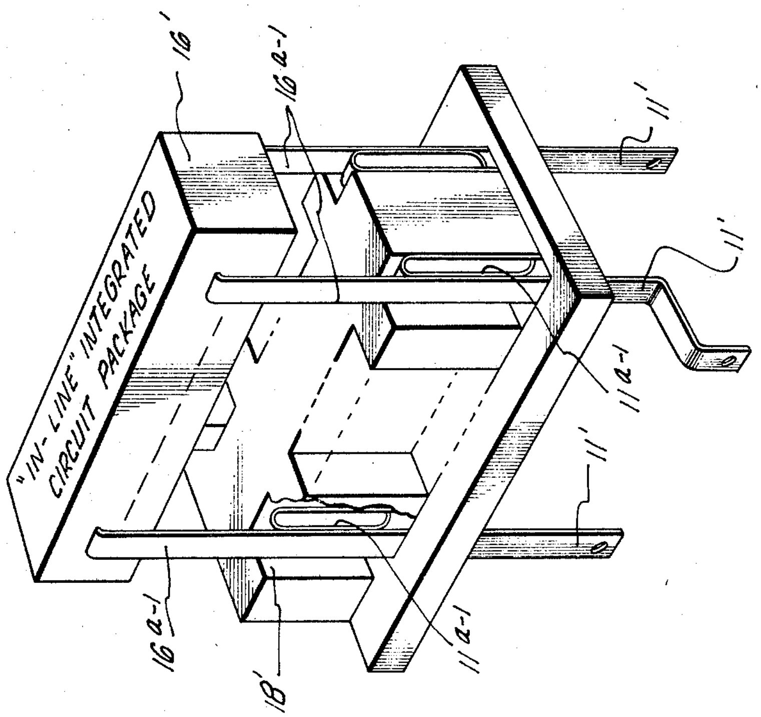
FIG. 2 is an exploded view of the microcircuit hardware of the present invention, with the cover member omitted, as applied to a modified circuit package.
Figure 2:
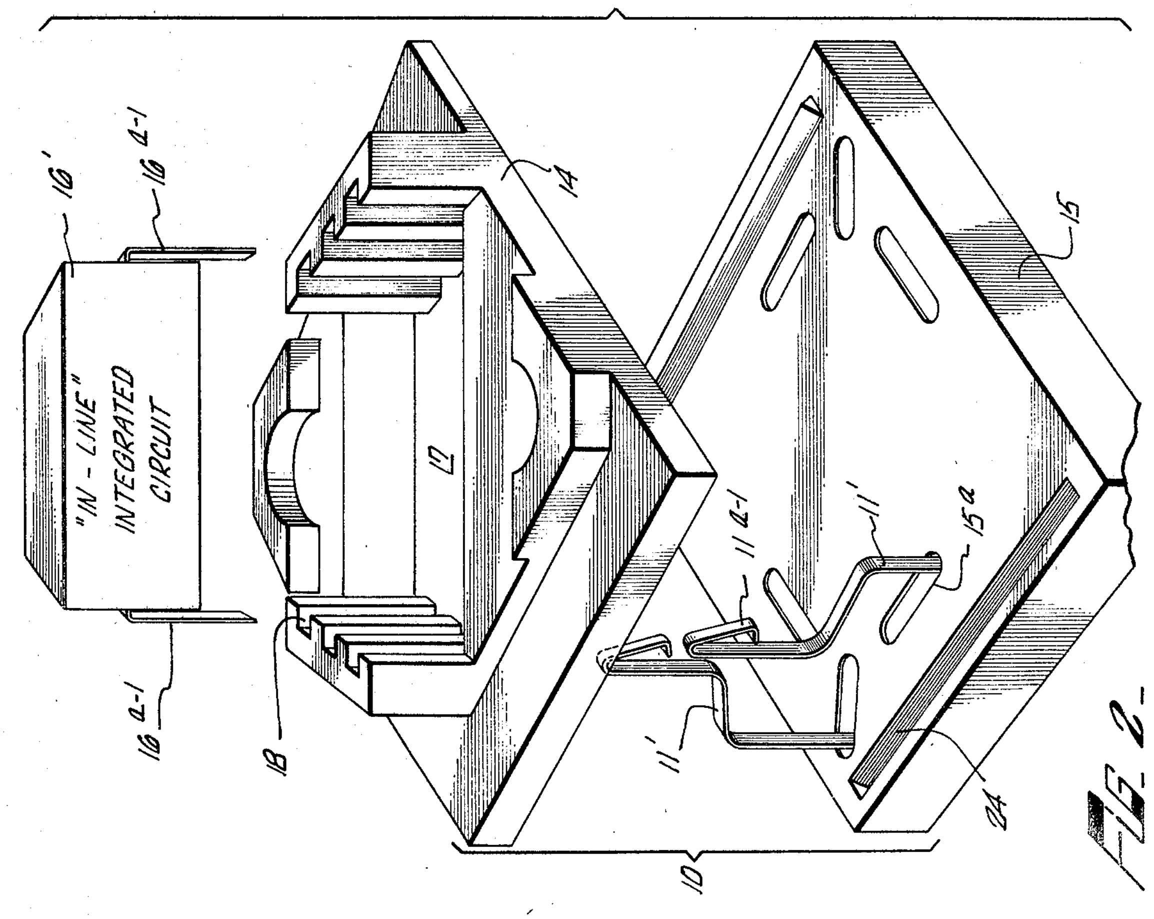
Figure 5:
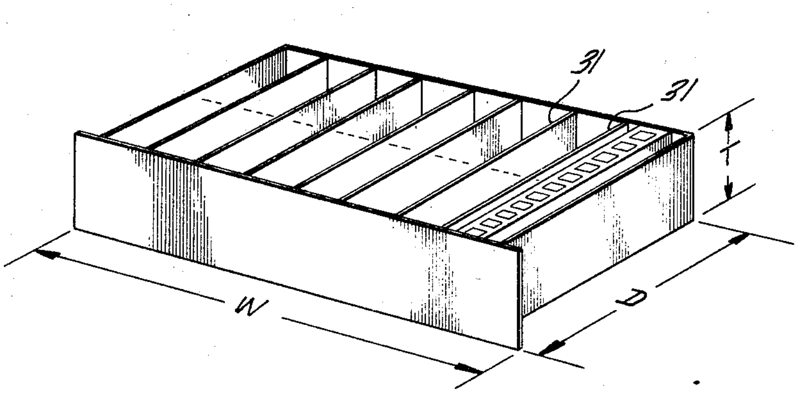
Figures 3, 4:
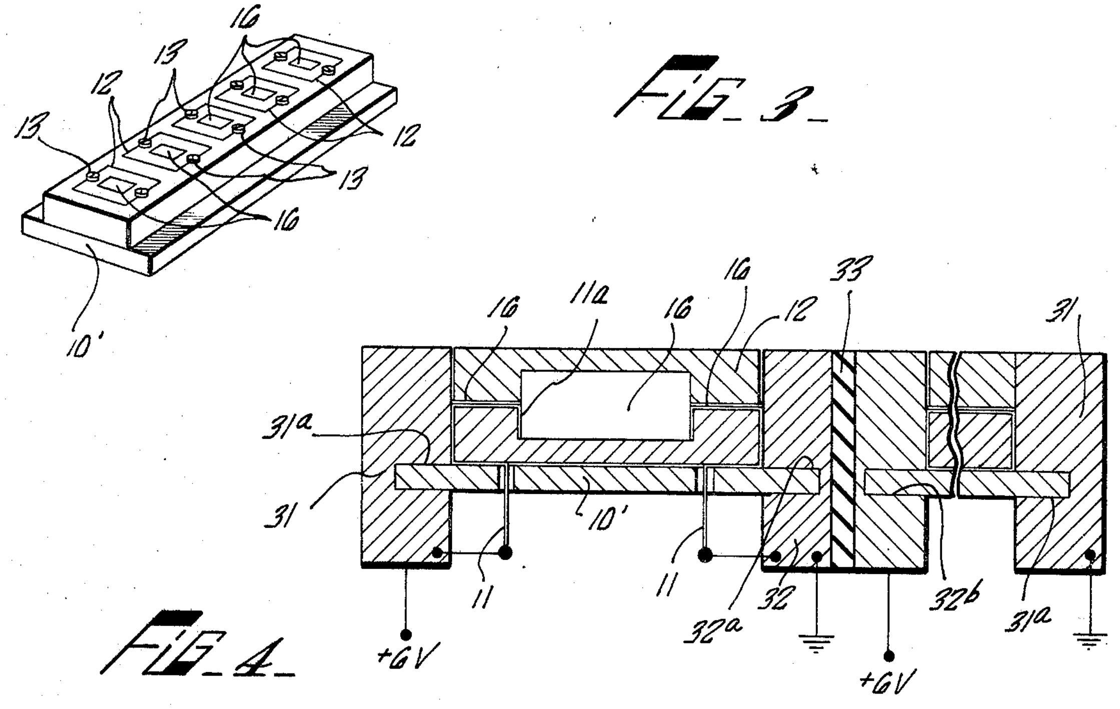

FIG. 2*a* is a partial, exploded view of another microcircuit hardware as applied to the same type of modified circuit package as illustrated in FIG. 2;

FIG. 3 is a schematic view of a microcircuit "stick" embodying the present invention;

FIG. 4 is a partial, cross-sectional view of a typical microcircuit hardware-bus bar system in accordance with the present invention; and FIG. 5 is a diagrammatic illustration of an equipment drawer for storing the microcircuit hardware of the present invention.

Figure 1:
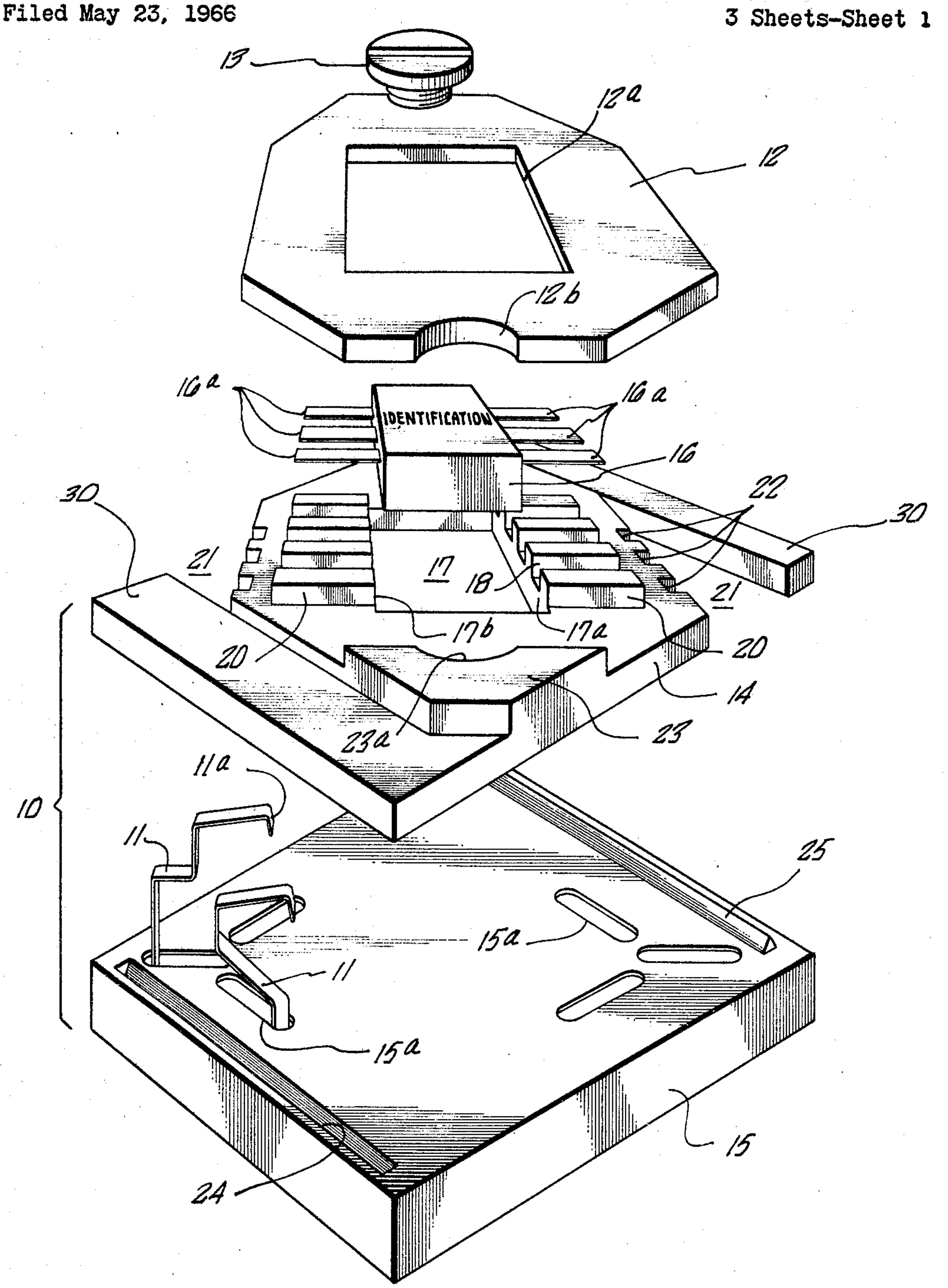
FIG. 1 is an exploded view of the microcircuit hardware, including the integrated circuit package, embodying the prevent invention.

Now referring to the drawings, the integrated circuit hardware of the present invention will be examined in more detail. The hardware of the present invention basically comprises a base member 10. The base member 10 functions to mount an integrated circuit package and maintain the electrical conductors or ribbons thereof in an insulative spaced-apart relationship. The base member 10 further includes means for mounting electrical conductive means for electrical engagement with the conductive ribbons of the microcircuit package. The electrical conductive means are illustrated in FIG. 1 as individual electrical contacts or conductors 11 held by the base member 10. For securing the microcircuit package to the base member 10 to a cover member 12 is provided. The cover member 12 is provided with a viewing aperture 12ᵃ for viewing and identifying the microcircuit package and may be secured to the base member 10 by any convenient means, one of a pair of mounting screws 13 being illustrated. The base member 10 may be constructed in two pieces as illustrated in FIG. 1. One of the pieces may be considered as a mounting base 14 for receiving and holding the microcircuit package while the other piece may be considered as a contact retainer 15 coacting with the mounting base 14, as will be described more fully hereinafter.

Microcircuit packages that are presently available are flat microcircuit packages, as particularly illustrated in FIG. 1, and the "in line" flat package as illustrated in FIG. 2, as well as microcircuit packages having a circular configuration and are commonly identified as "TO–5 cans". It should be appreciated at the outset that the present invention may be adapted for use for both the flat integrated circuit packages as well as the TO–5 cans. Merely for purposes of convenience in describing the invention the integrated circuit package is shown as a typical flat integrated circuit package having a square outline and identified by the reference character 16. The "in line" package will be described in conjunction with FIG. 2 immediately hereafter. The type of packaged circuit is indicated in the drawing by the legend "identification." It should be further appreciated that the structure for the integrated circuit hardware to be described is particularly adapted for receiving and handling the flat microcircuit package and that one skilled in the art need only change the disclosed structure to conform to the configuration of the TO–5 cans and the lead wires thereof to adapt the present invention to such a microcircuit or integrated circuit package.

The base member 10 will now be considered as it is constructed in two pieces comprising the mounting base 14 and the contact retainer 15. The mounting base 14 may have a general rectangular or square configuration with a substantially central mounting socket 17 for receiving and holding the flat microcircuit package 16. The microcircuit package 16 in its normal configuration has a plurality of electrical conductors or ribbons 16$^a$ extending outwardly from opposite sides therefrom, as illustrated, the electrical conductor 16$^a$ being essentially in the same plane by extending from opposite sides of the microcircuit package 16 proper. The mounting base 14 of the base member 10, then, is provided with a plurality of contact-receiving sockets 18 arranged on opposite sides of the mounting socket 17 for receiving and holding the conductive ribbon 16$^a$ in an insulative spaced-apart relationship. To this end, the mounting sockets 18 are defined in terms of upstanding, spaced-apart members 20 extending from the opposite edges 17$^a$ of the mounting socket 17 outwardly therefrom a preselected distance in accordance with the usual lengths of the conductors 16$^a$.

The mounting base 14 is further defined with a contact-receiving aperture 21 spaced outwardly of the contact-receiving sockets 18. The aperture 21 is constructed and defined to have a configuration for allowing individual contacts extending from the contact-retaining element 15 of the base member 10 into the contact-mounting socket 20. For this purpose, the edge of the apertures 21 adjacent the mounting sockets 18 are defined with a plurality of contact-receiving sockets 22 corresponding to the contact-receiving sockets 18. To this end, the sockets 22 may be considered as notches aligned with the sockets 20 on the face of the mounting base 14 and receiving and holding the contacts provided with the contact retainer 15.

The mounting base 14 further comprises a mounting stop 23 arranged on the opposite sides of the mounting socket 17, the two sides adjacent the mounting sockets 18, as illustrated in FIG. 1. The mounting stop 23 comprises an upstanding portion defined adjacent the inner extremities of the aperture 21 and having a configuration for accepting the cover 12 and the mounting means therefor. To this end, the mounting means is illustrated as one of a pair of mounting screws 13 having a flat head for engaging the top surface of the stop surface 23 and overlying the top surface of the cover 12 for securing the cover and the mounting base 14 together. To this end, the stop 23 is defined with a partial circular configuration on its inner end to accept the mounting screw, of the type of screws 13, and which circular portion is identified by the reference numeral 23$^a$.

The contact retainer 15 of the base member 10 may have the same general configuration as the mounting base 14 in that the mounting base overlies the contact retainer 15 when constructed as two pieces. The contact retainer 15 of the base member 10, then, merely functions to retain the contacts 11 in the desired relationship for engaging the conductive ribbons 16$^a$ of the integrated circuit package 16. For this purpose, mounting apertures 15$^a$ are constructed and defined in the contact retainer 15 to extend therethrough and accept the contacts 11. For this purpose, the apertures 15$^a$ may be arranged in a preselected pattern or in a grid-like fashion to accept the contacts 11 and allow them to extend between the mounting sockets 18 and outwardly of the bottom side of the contact retainer 15. The contacts 11 may have a preselected configuration to extend from an individual aperture 15$^a$ upwardly through the contact-receiving apertures 21 for the mounting base 14 and engaging a mounting socket 22 and extending into the corresponding mounting socket 18. The contacts 11 may have the inner ends defined with a hook-like portion 11$^a$ for extending from the mounting sockets 18 into the mounting socket 17 to be hooked thereon and thereby be retained in the correct alignment and in electrical engagement with the electrical conductor 16$^a$ for the electrical circuit package 16. The contacts 11 necessarily have a preselected configuration to cause them to extend and engage the correct conductor 16$^a$, as illustrated in FIG. 1. In the same fashion, the apertures 15$^a$ are defined to have a length and location to accept the individual contacts to provide the correct relationship with the corresponding mounting socket 18. Although in present day integrated circuit packages a number of electrical conductors are provided therewith, on the order of 10 to 14, only six such conductors are illustrated. It should now be appreciated that the opposite ends of the contacts 11 from the hook end 11$^a$ may extend outwardly from the contact retainer 15 any preselected amount to be connected in the desired electrical circuit relationship.

The cover 12 is of a planar construction and may be considered to have the same general configuration as the base 10 and to overlie the mounting base 14. The cover 12 includes a substantially central aperture 12$^a$ dimensioned relative to the integrated circuit package 16 to allow the identification on the integrated circuit package to be visable when the package 16 is held by the integrated circuit hardware of the present invention. The cover includes coacting partially circular surfaces 12$^b$ arranged on opposite sides of the viewing aperture 12$^a$ and coacting with the surface 23$^a$ for the mounting base 14 to receive the mounting sockets 13, as previously described. Accordingly, the flat head for the mounting screws 13 overlies the cover 12 as well as the stop surface 23 of the mounting base 14 to secure these two elements together. It should also be noted that the securing of the cover 12 and the mounting base 14 together functions to provide the necessary pressure to cause the interengagement in an electrical fashion of the conductive ribbon 16$^a$ and the contacts 11.

The correct registration or interengagement of the mounting base 14 and the contact retainer 15 is provided by means of a registration socket 24 provided adjacent the lefthand edge of the contact retainer of FIG. 1 for receiving a similarity configurated dependent member (not shown) for the mounting base 14 (not shown). The righthand edge of the contact retainer 15 is illustrated with an upstanding portion 25 to be received in a socket defined on the underside of the mounting base 14 (not shown) to be received therein. The interengagement or the holding of the mounting base 14 and the contact retainer 15 together may be provided by any convenient arrangement including snap-locking the two members together.

It will now be recognized by those skilled in the art that the elements comprising the integrated circuit hardware of the present invention are preferably constructed of an insulative material such as a plastic or the like which may be readily manufactured at high rates. Accordingly, the insulative relationship of the contact $16^a$ is maintained by the contacts 11 and which contacts may extend outwardly from the same face of the contact retainer 15 for interengagement with the correct electrical circuit.

Now referring to FIG. 2, the embodiment of the invention as constructed for the integrated "in line" package will be described. The "in line" package configuration is defined with the electrical conductors therefore extending therefrom at an angle of approximately ninety degrees, as illustrated. The construction of the hardware of FIG. 2 is then essentially the same as that described in conjunction with FIG. 1 except to accommodate the difference in microcircuit configuration. To this end, the contact receiving sockets 18 are oriented ninety degrees to receive the contacts $16^{a-1}$ for the "in line" package 16'. Consistent with this configuration, the electrical contacts or conductors 11 of FIG. 1 are modified in their configuration to lie adjacent contacts $16^{a-1}$ as they are placed in the mounting sockets 18, as illustrated.

The contacts $16^{a-1}$ lie in the sockets 18 with the contacts 11' lying adjacent same and outside thereof and in electrical contact therewith. It will be noted that contact position $11^{a-1}$ is modified by turning it down approximately ninety degrees from the position illustrated in FIG. 1.

FIG. 2*a* illustrates a portion of a modified microcircuit hardware for the "in line" integrated circuit package 16'. In this embodiment the base member 14 the comb pattern of sockets 18' face outwardly of the base member to accept the electrical contacts $16^{a-1}$, as illustrated. The remaining portion of the hardware is of the same general configuration as illustrated in FIG. 2.

An important aspect of the integrated circuit hardware of the present invention is that the mounting base 14 of the base member 10 may be constructed integral with the contact retainer 15 and when constructed in such a fashion, provides a planar surface adjacent the apertures 21. The planar surfaces are identified by the reference numerals 30 on the opposite side of the apertures 21 from the sockets 22 and co-extensive with the base 10. These planar surfaces 30 are defined to be slidably received in a guide member, as will be described more fully hereinafter.

Considering the base member 10 to a comprise the mounting base 14 and the contact retainer 15 constructed as a single piece, it should also be appreciated that the length thereof may be extended to accept a plurality of integrated circuit packages for defining a "microcircuit stick," as illustrated in FIG. 3. The microcircuit packages 16 are then mounted and held on such a "microcircuit stick" in a spaced-apart insulative relationship. The integrated circuit packages 16 may be held and maintained in the correct relationship on the base member 10 through the provision of similar cover members of the same general type of the cover member 12 or individual cover members 12 (as illustrated).

The important feature of the microcircuit stick of FIG. 3 is the ease with which it may be arranged into a microcircuit package system without reference to its use with a printed circuit board. For this purpose, a pair of electrical conductors similar to the conductor 31 illustrated in FIG. 4 may be provided. The electrical conductor 31 is shown illustrated with a generally similar electrical conductor 32 spaced therefrom a preselected distance in accordance with the dimensions of the base member 10' for the "microcircuit stick." The electrical conductor 32 is a double-faced conductor with an insulative portion 33 arranged substantially central thereof for electrically insulating the opposite faces of the conductor 32. Both the conductors 31 and 32, then, may function as a bus bar system for powering the integrated circuit packages held by the integrated circuit hardware of the present invention either individually or in the "microcircuit stick" of the type FIG. 3. For this purpose, the electrical conductors 31 are each defined with a track intermediate their ends for accepting the microcircuit hardware, as illustrated in FIG. 4. The track for the electrical conductor 31 is identified by the reference character $31^a$ which may have a general C cross-sectional configuration, while the coacting track for the electrical conductor 32 is identified by the reference character $32^a$. The track on the opposite side of the conductor 32 is identified by the reference character $32^b$. It will be assumed that a power source or a source of electrical current is connected to the electrical conductors 31 and 32. One of the conductors, for example, the conductor 32, may be directly connected to ground with the conductor 31 being connected to the opposite terminal of the power source, shown as a +6.0 terminal. With all of the electrical contacts 11 extending from the bottom side of the base member 10', it should be appreciated that all the ground connections may be electrically connected by soldering or the like to the electrical connector 32, while one or more of the remaining contacts 11 is electrically connected to the conductor 31 providing the power connection. The remaining contacts 11 are used for signal interconnections.

With this arrangement it should be evident that the integrated circuit hardware of the present invention either in the individual hardware form, illustrated in FIGS. 1 and 2, or the "microcircuit stick" of FIG. 3 may be slidably received by the electrical bus bar system and mounted in the correct electrical relationship. Furthermore, it should be apparent that the addition of a third electrical conductor arranged for coaction with the electrical conductor 32 that another series of integrated circuit packages may be handled and interconnected in the same general fashion as illustrated in FIG. 4.

With the series of spaced-apart electrical conductors 31 mounted in an equipment drawer, for example, as illustrated in FIG. 5, and suitably connected with a source of power, the microcircuit packages held by the hardware of the present invention may be conveniently stored in a drawer of the type illustrated in FIG. 5 without need to employ printed circuit card systems therefor. For example, a typical equipment drawer may have an overall dimension of 19 inches in width, W, 18 inches deep, D, and be 1¾ inches in thickness, T, for storing 48 sticks of five microcircuits each, or 240 individual microcircuits.

What is claimed is:

1. A microcircuit assembly system for direct wiring of microcircuit packages comprising a pair of electrically conductive mounting elements arranged in substantially the same plane and spaced apart a preselected dimension, said mounting elements having a configuration for slidably receiving and holding a microcircuit package assembly therebetween and functioning as electrical conduits to the held microcircuit package when electrically connected thereto, the mounting elements being double-faced conductive elements with a central insulative section for defining independent bus bars for a microcircuit package assembly, the microcircuit package assembly including a plurality of microcircuit packages longitudinally mounted in a side by side relation between the mounting elements.

2. A microcircuit assembly as defined in claim 1 including at least an additional mounting element spaced a preselected dimension from one of the aforementioned mounting elements and constructed and defined substantially the same as said aforementioned elements, said additional mounting element coacting with the adjacent element for mounting another microcircuit package assembly with the opposite sides of the mounting elements powering the adjacent microcircuit package assemblies.

References Cited

UNITED STATES PATENTS

| | | | |
|---|---|---|---|
| 3,011,379 | 12/1961 | Corwin | 339—17 X |
| 3,258,650 | 6/1966 | Fiege | 317—101 |
| 3,290,559 | 12/1966 | Kirby et al. | 339—17 X |
| 3,297,974 | 1/1967 | Pittman | 339—17 |
| 3,341,806 | 9/1967 | Joachim | 339—17 X |
| 3,345,541 | 10/1967 | Cobaugh et al. | 339—17 X |
| 3,354,394 | 11/1967 | James | 339—17 X |

RICHARD E. MOORE, Primary Examiner

U.S. Cl. X.R.

339—119